United States Patent
Chou et al.

(10) Patent No.: US 7,466,786 B2
(45) Date of Patent: Dec. 16, 2008

(54) RATIONAL NUMBER FREQUENCY MULTIPLIER CIRCUIT AND METHOD FOR GENERATED RATIONAL NUMBER FREQUENCY

(75) Inventors: Wen-Hwa Chou, Taipei (TW); Yu-Kuo Chen, Taipei (TW); Kuo-Jen Kuo, Taipei (TW)

(73) Assignee: Prolific Technology Inc., Taipei (TW)

( * ) Notice: Subject to any disclaimer, the term of this patent is extended or adjusted under 35 U.S.C. 154(b) by 601 days.

(21) Appl. No.: 11/161,955

(22) Filed: Aug. 24, 2005

(65) Prior Publication Data

US 2006/0280275 A1 Dec. 14, 2006

(30) Foreign Application Priority Data

Jun. 9, 2005 (TW) .............................. 94119010 A

(51) Int. Cl.
*H03D 3/24* (2006.01)
(52) U.S. Cl. ................. 375/375; 327/115; 327/116; 327/117; 327/119
(58) Field of Classification Search ......... 375/373–377; 327/115–119, 120–122
See application file for complete search history.

(56) References Cited

U.S. PATENT DOCUMENTS 5,553,100 A * 9/1996 Saban et al. ................. 375/340
5,955,902 A * 9/1999 Takada et al. ............... 327/116
6,147,525 A * 11/2000 Mitani et al. ................ 327/119

FOREIGN PATENT DOCUMENTS

TW 356624 4/1999

* cited by examiner

*Primary Examiner*—Curtis B Odom
(74) *Attorney, Agent, or Firm*—Jiang Chyun IP Office

(57) ABSTRACT

A rational number frequency multiplier circuit and a method for generating rational number multiple frequency are disclosed. The circuit receives a plurality of input signals having the same frequency and different phase, and outputs at least one multiple frequency signal. The rational number frequency multiplier circuit includes a frequency divider module, for receiving and dividing the input signals to output frequency-divided signals having the same frequency and different phase; a first phase synthesis module and a second phase synthesis module for receiving and synthesizing the frequency-divided and input signals respectively into a plurality of first pulse period signals and second pulse period signals; and an adder for receiving and combining the first pulse period signals and the second pulse period signals into the multiple frequency signal according to the desired multiplication of the frequency.

13 Claims, 6 Drawing Sheets

RATIONAL NUMBER FREQUENCY MULTIPLIER CIRCUIT AND METHOD FOR GENERATED RATIONAL NUMBER FREQUENCY

CROSS-REFERENCE TO RELATED APPLICATION

This application claims the priority benefit of Taiwan application serial no. 94119010, filed on Jun. 9, 2005. All disclosure of the Taiwan application is incorporated herein by reference.

BACKGROUND OF THE INVENTION

1. Field of the Invention

This invention generally relates to a frequency multiplier circuit, and especially to a rational number frequency multiplier circuit.

2. Description of the Related Art

A frequency multiplier circuit, when used in a digital system, can generate clock pulse signals of integrated circuit. In general, the frequency multiplier circuit comprises a phase lock loop (PLL). FIG. 1 is a circuit block diagram of a conventional phase lock loop, which comprises four sub-circuit systems: a phase detector (PD), a charge pump (CP), a loop filter (LF) and a voltage controlled oscillator (VCO). The phase detector PD detects a difference between a reference signal and an inner oscillating signal, and transforms the compared result to two digital signal output. The charge pump CP transforms the two digital signals to a control voltage output. The loop filter LF filters high frequency portion of the control voltage. The voltage controlled oscillator VCO transforms the control voltage to an oscillating frequency output. However, when multiplying the reference frequency, the oscillation frequency of the voltage controlled oscillator VCO has to be increased and an additional frequency divider FD is needed, as shown in FIG. 2, such that the output frequency, which is a multiplication of the reference frequency, is fed back and frequency-divided, and then compared with the source reference frequency. Therefore, the signal with N multiple frequency can be obtained by simply adjusting frequency-divided number N of the frequency divider.

Another conventional technology is disclosed by Taiwan Patent No. 35662. However, the technology can only generate the integer multiple frequency. When producing a non-integer multiple frequency, a non-integer division must be performed by the frequency divider FD as shown in FIG. 2, which can be achieved by a Fractional-N frequency synthesizer which has a more complex circuit.

SUMMARY OF THE INVENTION

An object of the present invention is to provide a rational number frequency multiplier circuit, for generating integer multiple frequency signals and non-integer multiple frequency signals.

Another object of the present invention is to provide a rational number frequency multiplier method, for generating integer multiple frequency signals and non-integer multiple frequency signals.

The present invention provides a rational number frequency multiplier circuit, which receives a plurality of input signals with a same frequency and different phases, and outputs at least a multiple frequency signal. The rational number frequency multiplier circuit comprises a frequency divider module, a first phase synthesis module, a second phase synthesis module, and an adder. Wherein, the frequency divider module receives the input signals, divides the frequency of the input signals, and outputs a plurality of frequency-divided signals, wherein the divided frequency signals have a same frequency with different phases. The first phase synthesis module is coupled to the frequency divider module, receives and synthesizes the frequency-divided signals into a plurality of first pulse period signals. The second phase synthesis module receives and synthesizes the input signals into a plurality of second pulse period signals. The adder is coupled to the first phase synthesis module and the second phase synthesis module, receives the first pulse period signals and the second pulse period signals, and according to a desired multiplication of frequency, obtains and synthesizes the first pulse period signals and the second pulse period signals into multiple frequency signals.

The present invention also provides a rational number frequency multiplier method, to multiply the frequency of the multiple input signals, and obtains at least a multiple signal, wherein the multiple input signals have a first frequency and different phases. The method comprise: dividing the frequency of the input signals, and synthesizing the frequency-divided signals into a plurality of first pulse period signals; synthesizing the input signals into a plurality of second pulse period signals; and according to a desired multiplication of frequency, obtaining and synthesizing the first pulse period signals and the second pulse period signals into the multiple frequency signals.

According to the rational number frequency multiplier method of the embodiment of the present invention, the above-mentioned input signals and frequency-divided signals are the default phase difference.

The present invention uses the wave synthesis method. When changing the dividing frequency number of the frequency divider module, according to a desired multiplication of frequency, the corresponding signals are obtained from the wave of the first phase synthesis module and the wave of the second phase synthesis module, and the desired integer multiple frequency signals and non-integer multiple frequency signals can be obtained.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE EMBODIMENTS

Figure 1:
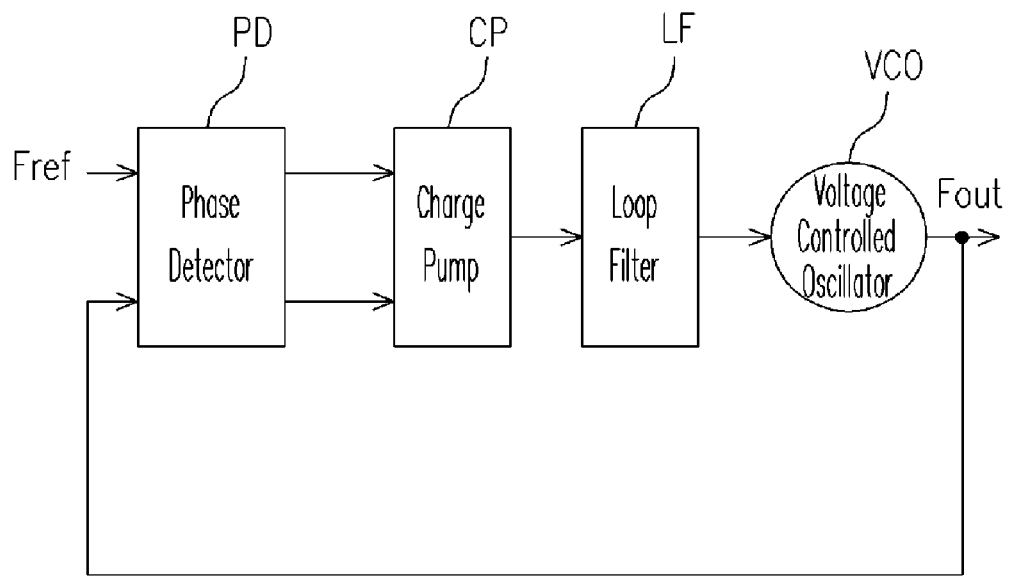
FIG. 1 is a circuit block diagram of a conventional phase lock loop.
Figure 2:
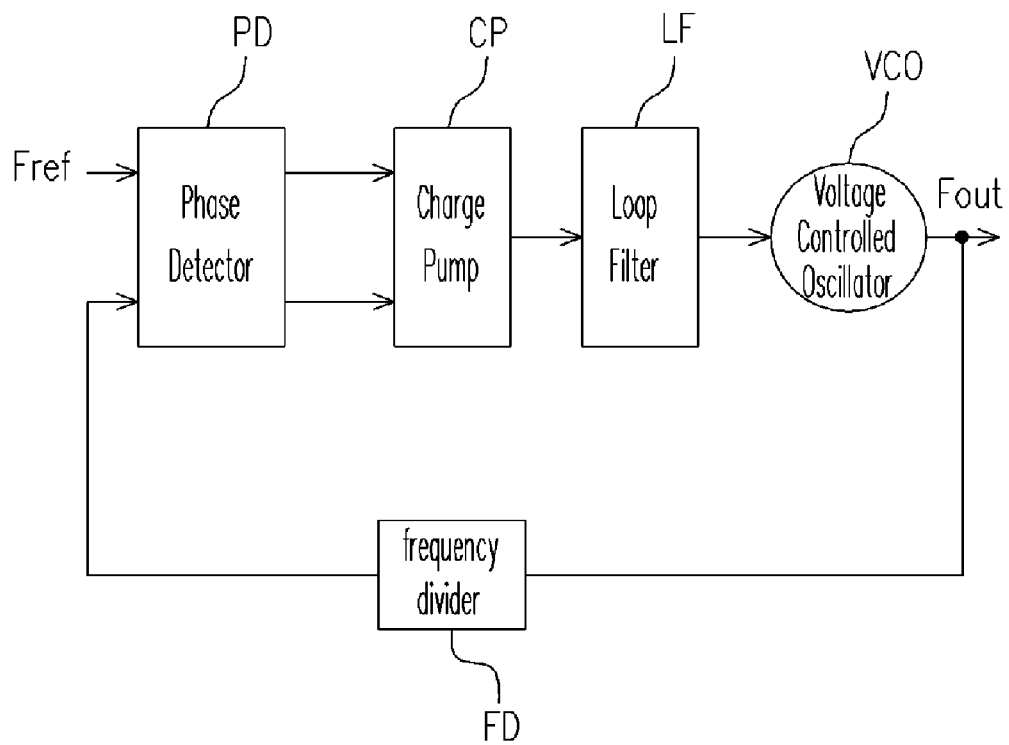
FIG. 2 is a circuit block diagram of generating multiple frequency signals by a phase lock loop.
Figure 3:
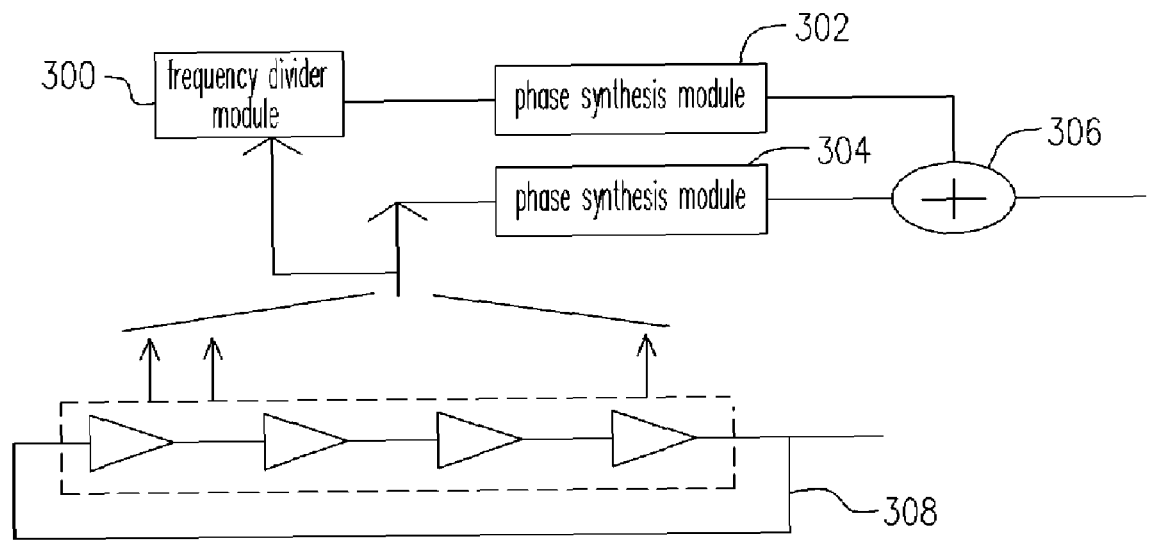
FIG. 3 is a circuit block diagram of a rational number frequency multiplier circuit according to an embodiment of the present invention.

FIG. 3 is a circuit block diagram of a rational number frequency multiplier circuit according to an embodiment of the present invention. The rational number frequency multiplier circuit receives a plurality of input signals with a same frequency and different phases, and outputs at least a multiple frequency signal. As shown in FIG. 3, the rational number frequency multiplier circuit comprises a frequency divider module 300, phase synthesis modules 302 and 304, an adder 306 and a circle oscillator 308. Though the circle oscillator is utilized in the embodiment of the present invention, it is known to those persons skilled in the art that phase lock loop, delay phase lock loop, and voltage controlled oscillator, can be used, which can generate the same frequency with different phases.

Figure 4:
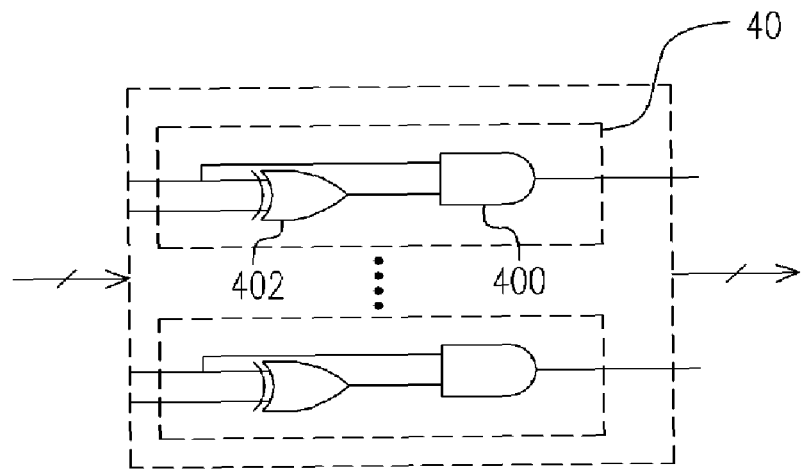
FIG. 4 is a circuit drawing of a phase synthesizer inside the rational number frequency multiplier circuit according to an embodiment of the present invention.

The frequency divider module 300 comprises a plurality of same frequency dividers. The phase synthesis modules 302 and 304 comprise a plurality of same phase synthesizers 40, as shown in FIG. 4. The circuit of the phase synthesizers 40 has a structure as shown in FIG. 4, comprising an AND gate 400 and a XOR gate 402, the output of the XOR gate 402 being coupled to the AND gate 400. The frequency divider module 300 and the phase synthesis module 304 respectively receive the input signals with the same frequency and different phases. The phase synthesis module 302 is coupled to the frequency divider module 300. The adder 306 is coupled to the phase synthesis modules 302 and 304.

The frequency divider module 300 receives the input signals, divides the frequency of the input signals, and outputs the frequency-divided signals. Meanwhile, the phase synthesis module 304 receives the input signals and synthesizes the signals whose phase difference is the default phase difference, into a plurality of second pulse period signals. The phase synthesis module 302 receives the frequency-divided signals outputted by the frequency divider module 300, and synthesizes the signals whose phase difference is the default phase difference into a plurality of first pulse period signals, wherein the first pulse period signals with a first duty period is generated according to the default phase difference, and the second pulse period signals with a second duty period is generated according to the default phase difference. Finally, the adder 306 receives the first pulse period signals outputted by the phase synthesis module 302 and the second pulse period signals outputted by the phase synthesis module 304, obtains and combines the corresponding signals, and synthesizes the multiple frequency signal, according to the desired multiplication of the frequency.

Figure 5:
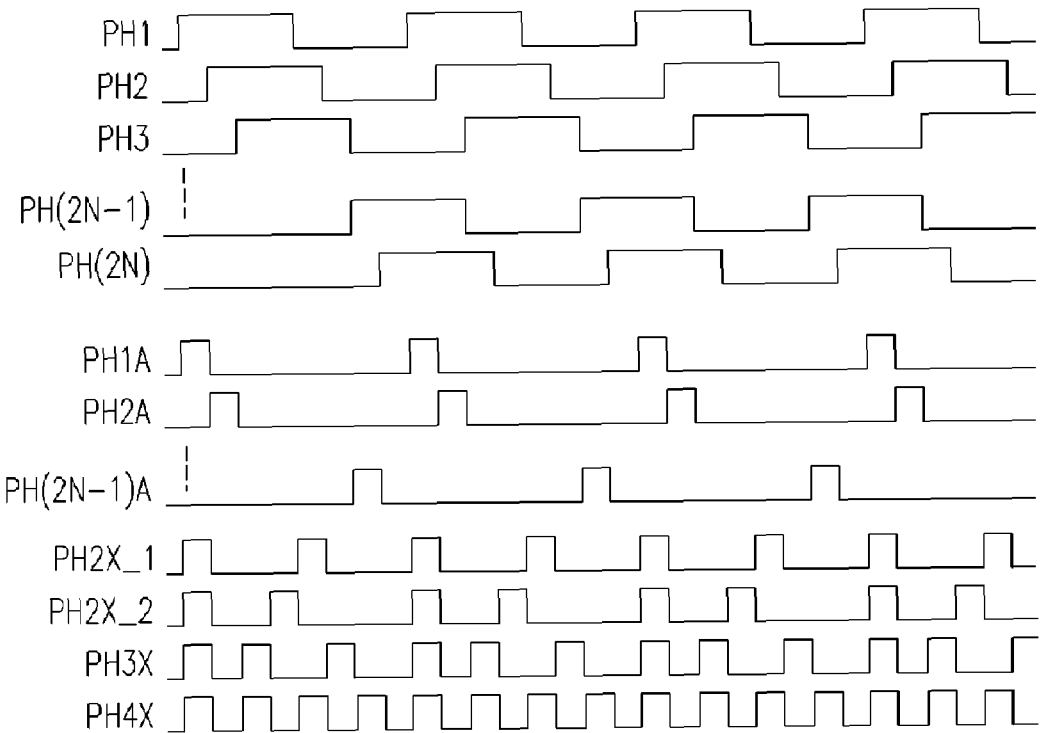
FIG. 5 is a wave drawing of generating integer multiple frequency signals according to an embodiment of the present invention.

FIG. 5 is a wave drawing of integer multiple frequency signals generated from the circuit block diagram as shown in FIG. 3 according to an embodiment of the present invention. As shown in FIG. 3, FIG. 4 and FIG. 5, first, the circle oscillator 308 generates 2N number of input signals with a same frequency and different phases as PH1, PH2 ... PH(2N) shown in FIG. 5, then the phase synthesis module 304 receives the signal PH1 to PH(2N) and respectively puts them into the inner phase synthesizer 40. For example, PH1 and PH2 are inputted into the phase synthesizer 40, further PH1A is obtained through the XOR gate and the AND gate, and PH2A is obtained from PH2 and PH3 through the phase synthesizer 40. PH3A to PH(2N−1)A are obtained in the same method as the above. When generating a double frequency, the double frequency, as PH2X−1 shown in the figure, can be obtained by inputting PH1A and PH(N+1)A to the adder 306. In the same method, the double frequency, as PH2X−2 shown in the figure, can be obtained by inputting PH1A and PHNA to the adder 306. Also, the double frequency (not shown), can be obtained by inputting PH1A and PH3A to the adder 306. When generating a triple frequency, the triple frequency, as PH3X shown in the figure, can be obtained by inputting PH1A, PH3A and PH6A to the adder 306. In the same method, a quadruple frequency, as PH4X shown in the figure, can be obtained by inputting PH1A, PH3A, PH5A and PH7A to the adder 306.

Figure 6:
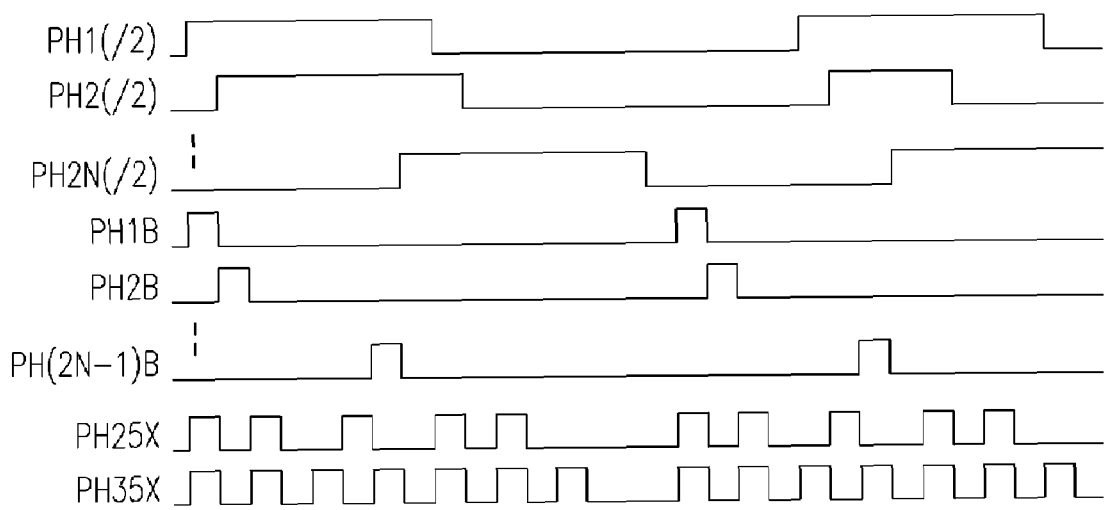
FIG. 6 is a wave drawing of generating rational number multiple frequency signals according to an embodiment of the present invention.

When generating a non-integer number multiple frequency signal, refer to the waves are shown in FIG. 6, also FIG. 3, FIG. 4 and FIG. 5. The dividing frequency number of the frequency divider module 300 is 2 in the embodiment. Also, the input signals utilize the circle oscillator 308 to generate input signals with 2N number of same frequency and different phases respectively as PH1, PH2, ... and PH(2N) shown in FIG. 5. The frequencies are divided by the frequency divider module 300 and PH1(/2), PH2(/2), ... and PHN(/2) are obtained, and the frequency-divided signals are inputted to the phase synthesis module 302. Further, the phase synthesis module 302 utilizes the logical operation method as shown in FIG. 4 to synthesize the waves PH1(/2), PH2(/2), ... and PHN(/2) as PH1B, PH2B, ... PH(2N−1)B, wherein the operation method is the same as the above mentioned. For example, when a 2.5 multiple frequency is required, the multiple frequency, as PH25X shown in the figure, can be obtained by inputting PH1A, PH3A and PH(N+3)B to the adder 306. In the same way, a 3.5 multiple frequency, as PH35X shown in the figure, can be obtained by inputting PH1A, PH3A, PH5A and PH7B to the adder 306, and other multiple frequencies, such as 4.5 multiplication, 5.5 multiplication etc, can be obtained by those persons skilled in the art with permutation and combination.

Figure 7:
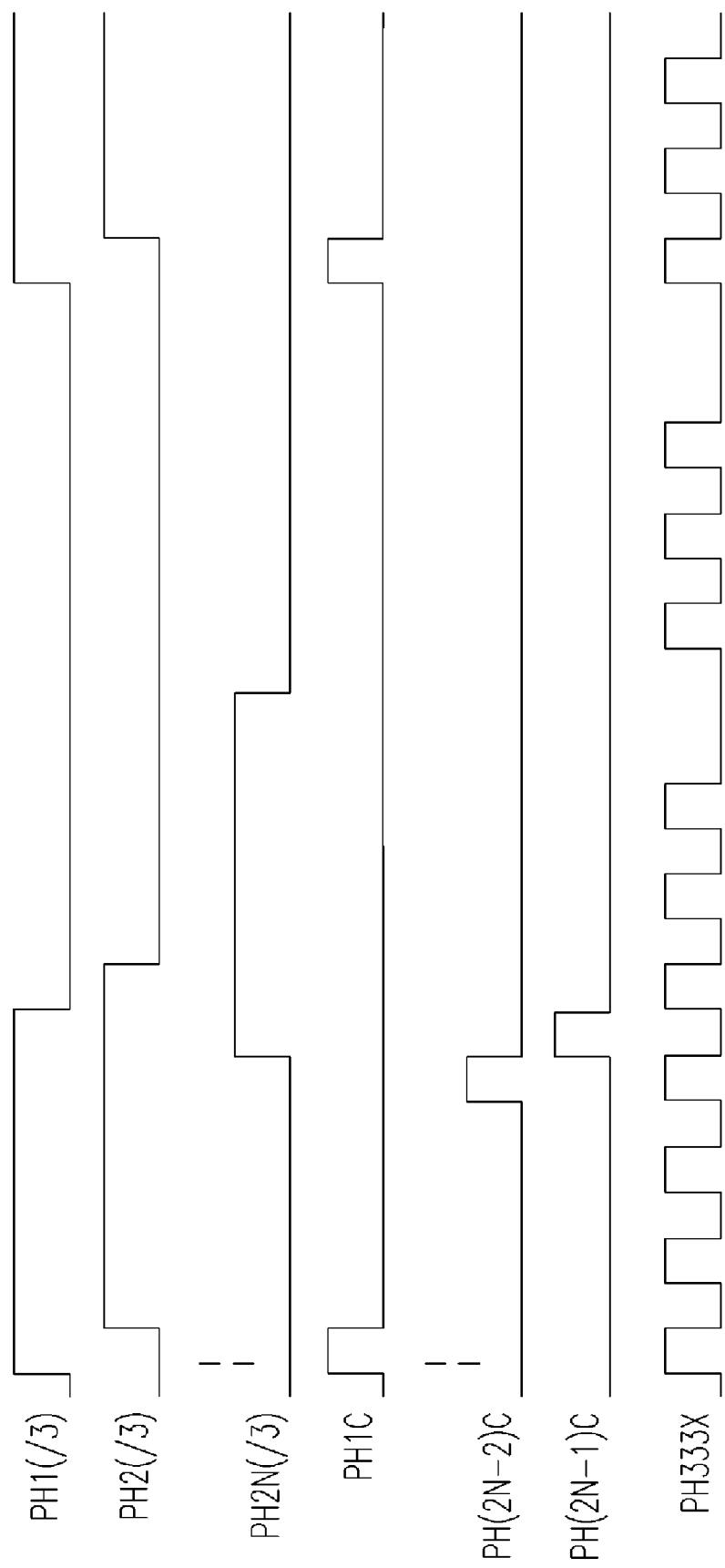
FIG. 7 is a wave drawing of generating rational number multiple frequency signals according to another embodiment of the present invention.
Figure 8:
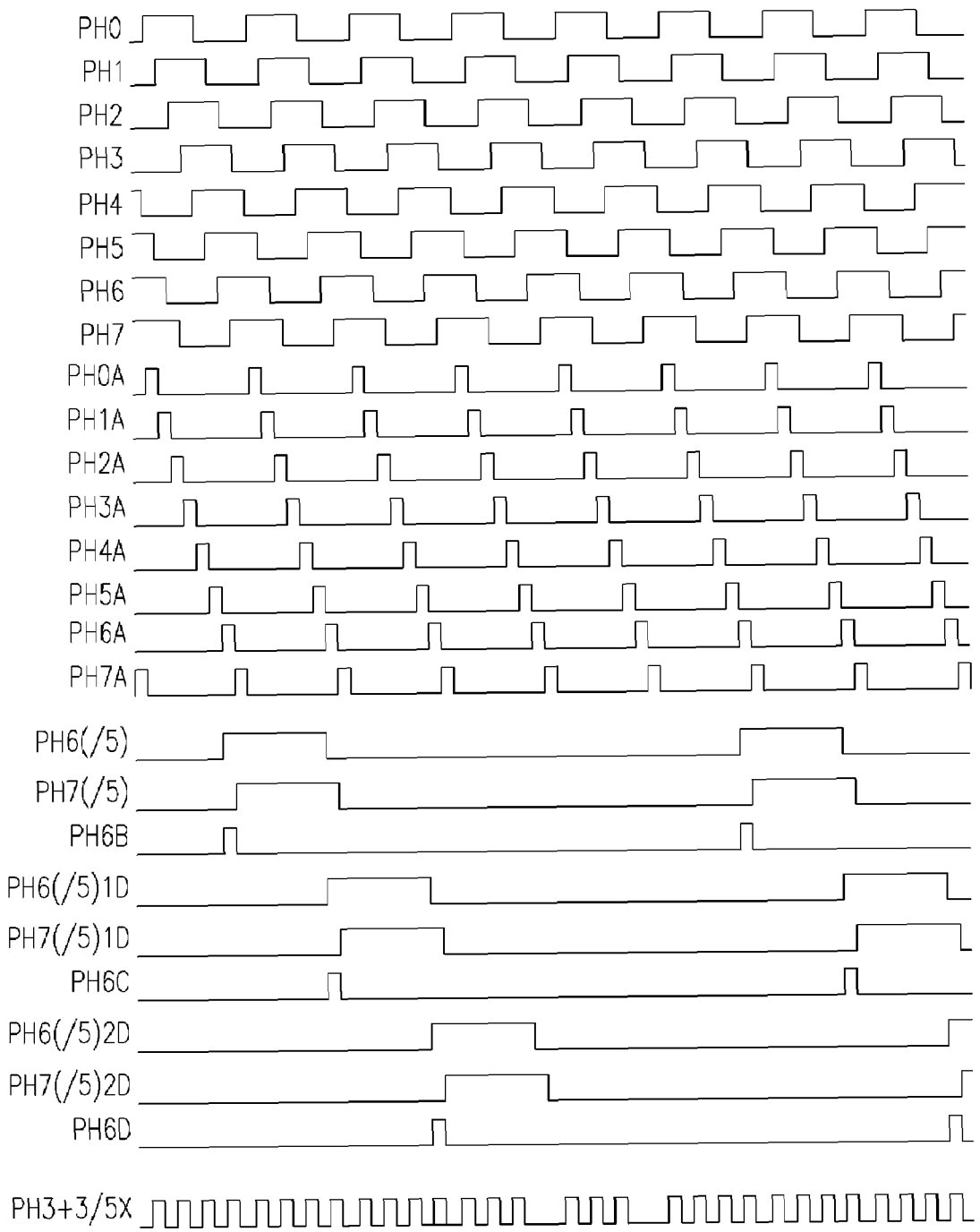
FIG. 8 is a wave drawing of generating rational number multiple frequency signals according to another embodiment of the present invention.

In the same way, a 3.3 multiple frequency can be obtained by the same technology, referring to the waves in FIG. 7, also FIG. 3, FIG. 4 and FIG. 5. The dividing frequency number of the frequency divider module 300 is 3 in the embodiment. The input signals utilize the circle oscillator 308 to generate eight input signals with same frequency and different phases respectively as PH1, PH2, ... and PH(2N) shown in FIG. 5, wherein the frequencies are divided by the frequency divider module 300 and PH1(/3), PH2(/3), ... and PHN(/3) are obtained, and the frequency-divided signals are inputted to the phase synthesis module 302. Further, the phase synthesis module 302 utilizes the logical operation method as shown in FIG. 4 to synthesize the waves PH1(/3), PH2(/3), ... and PHN(/3) as PH1C, PH2C, ... PH(2N−1)C, wherein the operation method is the same as the above mentioned. The 3.3 multiple frequency, as PH333X shown in the figure, can be obtained by inputting PH1A, PH3A, PH5A and PH7C to the adder 306, Finally, for example, a 3+3/5 multiple frequency can be obtained by the same technology, referring to FIG. 8, also FIG. 3 and FIG. 4. The frequency-divided number of the frequency divider module 300 is 5 in the embodiment. First, the circle oscillator 308 is utilized to generate eight input signals with same frequency and different phases respectively as PH0 to PH7 shown in FIG. 8. The phase synthesis module 302 receives the signals PH0 to PH7, respectively puts them to the inner phase synthesizer 40 to perform the logical operation and synthesize them as PH0A to PH07, wherein the logical operation method is the same as the above mentioned.

The frequencies of PH6 and PH7 are divided by the frequency divider module 300 and PH(6/5) and PH(7/5) are obtained, and PH6B is obtained by inputting the PH(6/5) and PH(7/5) to the frequency divider module 302. PH6C is obtained by inputting the PH(6/5) and PH(7/5) to the frequency divider module 302, wherein one unit clock pulse signal time is delayed as PH(6/5) 1D and PH(7/5) 1D as shown in the figure. In the same way, PH6D is obtained by inputting the PH(6/5) and PH(7/5) to the frequency divider module 302, wherein two unit clock pulse signal time is delayed as PH(6/5) 2D and PH(7/5) 2D as shown in the figure. Finally, the 3+3/5 multiple frequency, as PH3+3/5X shown in the figure, can be obtained by inputting PH0A, PH2A, PH4A, PH6B, PH6C and PH6D to the adder 306.

Figure 9:
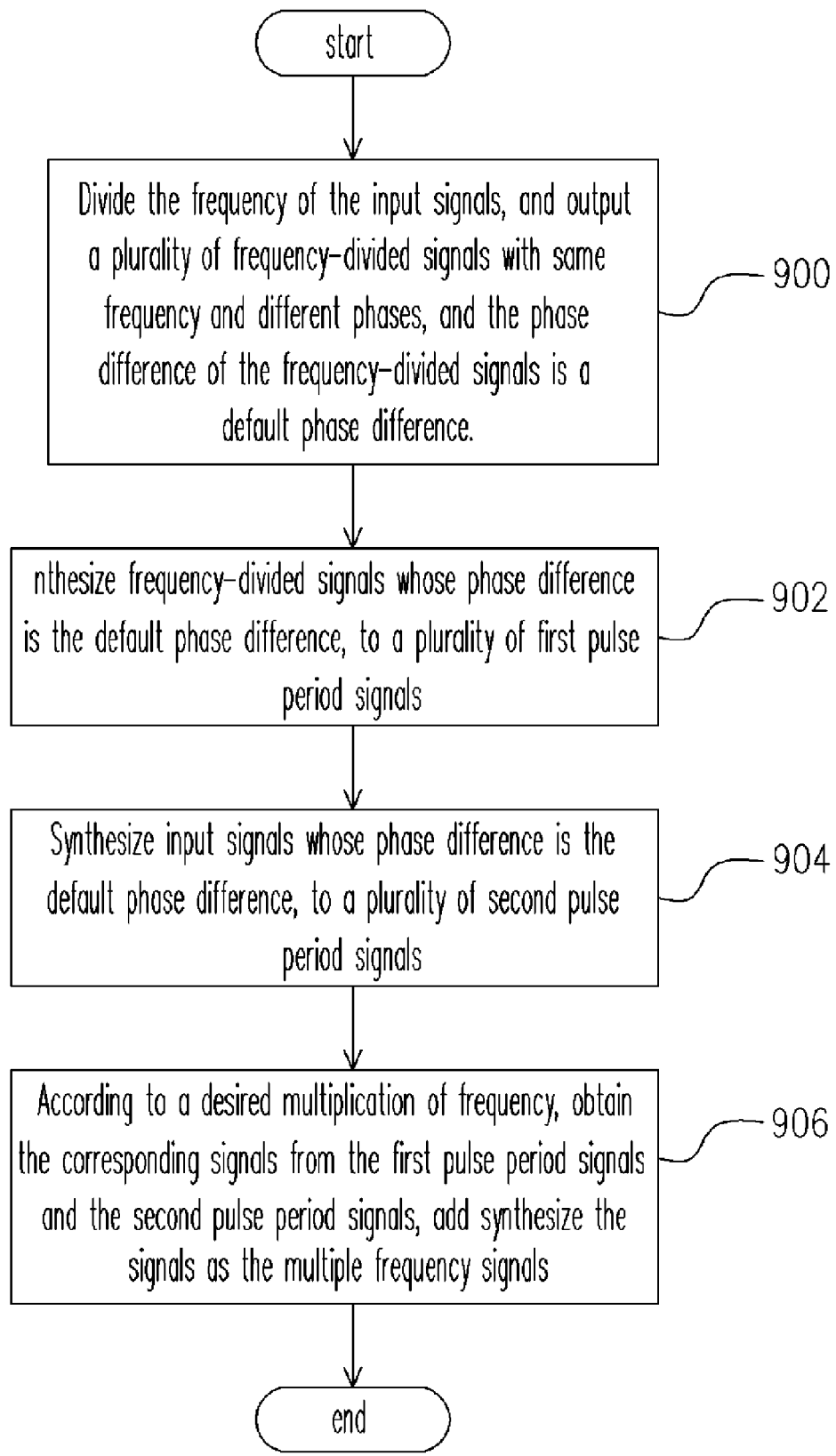
FIG. 9 is a flow chart of generating rational number multiple frequency according to an embodiment of the present invention.

The present invention also provides a rational number frequency multiplier method, for receiving a plurality of input signals with a same frequency and different phases and outputting at least a multiple signal. FIG. 9. is a flow chart of generating rational number multiple frequency according to an embodiment of the present invention. Please refer to FIG. 9, and FIG. 3, FIG. 4, FIG. 5 and FIG. 6. The frequency divider module 300 divides the frequency of the input signals, and outputs a plurality of frequency-divided signals with a same frequency and different phases, wherein the frequency-divided signals, as PH1(2), PH2(2), ... PHn(2) shown in FIG. 6, are the frequency-divided signals respectively divided by 2, and the phase differences of the frequency-divided signals are a default phase difference as shown in the step 900. The inner phase synthesizer 40 of the phase synthesis module 302 synthesizes signals into a plurality of first pulse period signals as PH1B, PH2B, ... PH(2N−1)B shown in FIG. 6, wherein the signals are frequency-divided signals and the phase differences are the default phase, and generates the first pulse period signals with a first duty period as shown in the step 902 according to the default phase difference. In the meantime, the phase synthesis module 304 synthesizes the frequency-divided signals into a plurality of second pulse period signals as PH1A, PH2A, ... PH(2N−1)A shown in FIG. 5, wherein the phase differences are the default phase, and generates the second pulse period signals with a second duty period as shown in the step 904 according to the default phase difference. According to a desired multiplication of frequency, the adder 306 obtains the corresponding signals from the first pulse period signals and the second pulse period signals, adds the signals as the wave PH35X shown in FIG. 6, and synthesizes the multiple frequency signals as shown in the step 906.

In summary, those skilled in the art can freely change the dividing frequency number of the frequency divider module without departing from the scope or spirit of the invention, permute and combine the waves of the phase synthesizers 302 and 304, to obtain the desired integer and non-integer multiple frequency signals. Here a relation equation can be obtained. When the circle oscillator 308 generates 2N number of signals with the same phase difference, and when the frequency-divided value of the frequency divider module 300 is M, the embodiment of the present invention can therefore obtain the frequency N−K/M, wherein K=1, 2, 3, ... (M−1), and N, K and M are integers.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A rational number frequency multiplier circuit, for receiving a plurality of input signals, and outputting at least a multiple frequency signal, wherein the input signals have a first frequency with different phases; the rational number frequency multiplier circuit comprising:
a frequency divider module, for receiving the input signals, dividing the frequency of the input signals, and outputting a plurality of frequency-divided signals;
a first phase synthesis module, coupled to the frequency divider module, for synthesizing the frequency-divided signals into a plurality of first pulse period signals;
a second phase synthesis module, for receiving the input signals, and synthesizing the input signals into a plurality of second pulse period signals;
an adder, coupled to the first phase synthesis module and the second phase synthesis module, wherein
according to a desired multiplication of frequency, the corresponding first pulse period signals and the second pulse period signals are added, for synthesizing and outputting the multiple frequency signals.

2. The rational number frequency multiplier circuit of claim 1, wherein the phase difference of the input signals is a default phase difference, and the phase difference of the frequency-divided signals is the default phase difference.

3. The rational number frequency multiplier circuit of claim 2, wherein according to the default phase difference, the first pulse period signals with a first duty period is generated.

4. The rational number frequency multiplier circuit of claim 2, wherein according to the default phase difference, the second pulse period signals with a second duty period is generated.

5. The rational number frequency multiplier circuit of claim 1, wherein the first phase synthesis module and the second phase synthesis module respectively comprise a plurality of phase synthesizers, each of the phase synthesizers comprising:
an XOR gate, for receiving two signals in the frequency-divided signals, performing an XOR logical operation to the two signals, and outputting the operation result; and
an AND gate, for performing an AND logical operation to one of the two signals received by the XOR gate, and the signal outputted by the XOR gate, and further outputting the operation result.

6. The rational number frequency multiplier circuit of claim 5, wherein the phase difference of the input signals is a default phase difference, and the phase difference of the two signals in the frequency-divided signals received by the XOR gate is the default phase difference.

7. The rational number frequency multiplier circuit of claim 1, further comprising a phase lock loop PLL, for generating the input signals.

8. The rational number frequency multiplier circuit of claim 1, further comprising a voltage controlled oscillator VCO, for generating the input signals.

9. The rational number frequency multiplier circuit of claim 1, further comprising a circle oscillator, for generating the input signals.

10. A rational number frequency multiplier method, applied to a rational number frequency multiplier circuit, for multiplying the frequency of multiple input signals, and obtaining at least a multiple signal, wherein the input signals have a first frequency with different phases; the method comprising:
dividing frequency of the input signals by a frequency divider module, and obtaining a plurality of frequency-divided signals, wherein the frequency-divided signals have same frequency with different phases;

synthesizing the frequency-divided signals into a plurality of first pulse period signals by a first phase synthesis module;

synthesizing the input signals into a plurality of second pulse period signals by a second phase synthesis module; and according to a desired multiplication of frequency, adding the corresponding first pulse period signals and the second pulse period signals to obtain the multiple frequency signals.

11. The rational number frequency multiplier method of claim 10, wherein the phase difference of the input signals is a default phase difference, and the phase difference of the divided frequency signals is the default phase difference.

12. The rational number frequency multiplier method of claim 10, wherein the phase difference of the input signals is a default phase difference, and according to the default phase difference, the first pulse period signals with a first duty period is generated.

13. The rational number frequency multiplier method of claim 10, wherein the phase difference of the input signals is a default phase difference, and according to the default phase difference, the second pulse period signals with a second duty period is generated.

* * * * *